(12) United States Patent
Bae et al.

(10) Patent No.: US 6,864,590 B2
(45) Date of Patent: Mar. 8, 2005

(54) ALIGNMENT MARK FOR ALIGNING WAFER OF SEMICONDUCTOR DEVICE

(75) Inventors: Sang-Man Bae, Ichon-Shi (KR); Hyeong-Soo Kim, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/743,715

(22) Filed: Dec. 24, 2003

(65) Prior Publication Data

US 2004/0261282 A1 Dec. 30, 2004

(30) Foreign Application Priority Data

Jun. 25, 2003 (KR) .................................. 2003-0041514

(51) Int. Cl.⁷ ........................................... H01L 23/544
(52) U.S. Cl. ...................... 257/797; 438/401; 438/462
(58) Field of Search .................. 33/613, 645; 257/797; 438/401, 462, 975; 356/138, 399–401

(56) References Cited

U.S. PATENT DOCUMENTS

| | | | | |
|---|---|---|---|---|
| 5,311,061 A | | 5/1994 | Sheck | |
| 5,640,053 A | * | 6/1997 | Caldwell | .................... 257/797 |
| 5,969,428 A | * | 10/1999 | Nomura et al. | ............. 257/797 |
| 6,049,137 A | * | 4/2000 | Jang et al. | ................... 257/797 |
| RE36,730 E | | 6/2000 | Nishi | |
| 6,133,111 A | * | 10/2000 | Sur et al. | ..................... 438/401 |
| 6,261,926 B1 | * | 7/2001 | King | ......................... 438/439 |
| 6,288,454 B1 | * | 9/2001 | Allman et al. | .............. 257/797 |
| 6,337,241 B1 | * | 1/2002 | Aoki | .......................... 438/243 |
| 6,357,131 B1 | * | 3/2002 | Cheng et al. | ................. 33/645 |
| 6,391,745 B1 | * | 5/2002 | Kwon | ......................... 438/462 |
| 6,395,617 B2 | * | 5/2002 | Ando | .......................... 438/401 |
| 6,590,274 B2 | * | 7/2003 | Ohsumi et al. | ............. 438/462 |
| 6,667,221 B2 | * | 12/2003 | Kitazawa et al. | ........... 438/401 |
| 6,720,667 B2 | * | 4/2004 | Kim | .......................... 257/797 |
| 2003/0143771 A1 | * | 7/2003 | Kidoguchi et al. | .......... 438/46 |

\* cited by examiner

*Primary Examiner*—G. Bradley Bennett
(74) *Attorney, Agent, or Firm*—Mayer, Brown, Rowe & Maw LLP

(57) ABSTRACT

The present invention relates to an alignment mark for use in a wafer alignment and a method for fabricating the same. The alignment mark for use in the wafer alignment includes: a first mark formed on a semiconductor layer; a second mark formed adjacent to the first mark on the semiconductor layer; and a concave part formed between the first mark and the second mark by etching a partial portion of the semiconductor layer, wherein the alignment mark is used to align a wafer by detecting a zeroth order diffract light reflected from a sloped surface formed because of a difference in height between the concave part and the first or second mark.

7 Claims, 8 Drawing Sheets

ALIGNMENT MARK FOR ALIGNING WAFER OF SEMICONDUCTOR DEVICE

FIELD OF THE INVENTION

The present invention relates to an alignment mark of a semiconductor device; and, more particularly to an alignment mark with use of an off-axis illumination effect and a method for fabricating the same.

DESCRIPTION OF RELATED ARTS

Generally, a highly integrated semiconductor device is fabricated by going through a complicated process using a plurality of superimposed photo-exposure masks. Particularly, each photo-exposure mask used for each necessary step is aligned on the basis of a specifically shaped mark.

This type of mark is called an alignment mark, a superimposition mark or an alignment key. Especially, this alignment mark is essentially required for an overlap process.

FIG. 1 is a constitution diagram showing a conventional projection photo-exposure apparatus. FIG. 2 is a conceptual diagram showing a detection mechanism of lights reflected and diffracted from an alignment mark.

Referring to FIG. 1, the projection photo-exposure apparatus includes a stage 8, a wafer 9 loaded onto the stage 8, a reticle 11 embedded within the projection photo-exposure apparatus for transmitting a pattern image of the reticle 11 into the wafer 9 by using an incident light such as i-line and ArF or deep ultraviolet (DUV) laser. Herein, the i-line and ArF have a wavelength of about 365 nm and about 196 nm, respectively.

At this time, another pattern is formed on the wafer 9, and a photoresist is coated thereon. Thus, the wafer 9 is needed to be aligned to superimpose the pattern image of the reticle 11 upon the pattern formed on the wafer 9. For the alignment of the wafer 9, the projection photo-exposure apparatus separately includes an alignment system 100 for aligning the wafer 9. The wafer alignment system 100 employs the well-known alignment method of laser scanning alignment (LSA). In addition to the LSA, there are other various alignment methods such as a filed image alignment (FIA) or a laser image alignment (LIA). For the wafer alignment, these alignment methods allow the image patterned on the wafer to be used accordingly relative to a shape of an alignment mark.

As shown in FIG. 1, the wafer alignment system 100 includes a light generating unit 101 for generating an alignment light source, a beam shaping unit 102 for determining a beam shape of the light source, a beam detector 105 and a beam splitter 103 for getting a light transmitted from the beam shaping unit 102 hit the wafer 9 through a beam guiding unit 104 and a projecting lens 7 and allowing a ± first order diffract light reflected from the wafer 9 to be detected again at the beam detector 105. Herein, the ± first order diffract light expresses the diffraction of the mth order, where m is 1 and −1.

Referring to FIG. 2, a plurality of alignment marks 10 are formed on the wafer 9 in a single pattern. After a transparent photoresist pattern 200 is formed, a light 13 incident to the wafer 9 through the projecting lens 7 is reflected from the alignment marks 10. At this time, a ± first order diffract light 14 hits the beam detector 105, and this detection initiates a wafer alignment.

In case of a semiconductor memory device, the alignment marks 10 are formed simultaneously with forming patterns in a cell region. Also, the alignment marks 10 are formed in a scribe lane which does not affect the cell region.

However, alignment marks are prone to damages while additionally performed processes such as a chemical mechanical polishing (CMP) process for fabricating a semiconductor device with about 100 nm line-width. Also, an increase in a deposition thickness of a thin layer makes it difficult to distinguish the alignment marks, further resulting in a difficulty in the wafer alignment.

That is, under the conventional alignment method described in FIGS. 1 and 2, alignment marks are formed on a wafer with uniform size and shape, and then, a diffract light of the mth orders, where m are ±1, ±3 and ±5 reflected from the alignment marks are used to make another mask pattern be aligned rightly upon the wafer. This alignment type aligns mask patterns by using selectively the diffracted lights reflected from the alignment marks formed in a uniform well type pattern. Thus, the alignment marks may become prone to damages during a CMP process exerting a certain degree of shocks onto the wafer. Also, it may become difficult to obtain a highly sensitive detection signal because the intensity of a beam reflected from the alignment marks decreases due to an increase in a deposition thickness of a thin layer. As a result, it may become further difficult to make a good wafer alignment, resulting in an overall decrease in yields of semiconductor devices.

SUMMARY OF THE INVENTION

It is, therefore, an object of the present invention to provide an alignment mark for use in a wafer alignment capable of obtaining a highly sensitive detection signal without an additional cost and a method for fabricating the same.

In accordance with an aspect of the present invention, there is provided an alignment mark for use in a wafer alignment, including: a first mark formed on a semiconductor layer; a second mark formed adjacent to the first mark on the semiconductor layer; and a concave part formed between the first mark and the second mark by etching a partial portion of the semiconductor layer, wherein the alignment mark is used to align a wafer by detecting a zeroth order diffract light reflected from a sloped surface formed because of a difference in height between the concave part and the first or second mark.

In accordance with another aspect of the present invention, there is also provided a method for fabricating an alignment mark for use in a wafer alignment, including the steps of: etching selectively a semiconductor layer by using a first mask pattern to form a plurality of concave parts with a predetermined consistent distance on the semiconductor layer; depositing a material on an entire surface of a structure containing the concave parts; and etching selectively the deposited material by using a second mask pattern to form a first mark and a second mark.

BRIEF DESCRIPTION OF THE DRAWING(S)

The above and other objects and features of the present invention will become apparent from the following description of the preferred embodiments given in conjunction with the accompanying drawings, in which.

Figure 7:
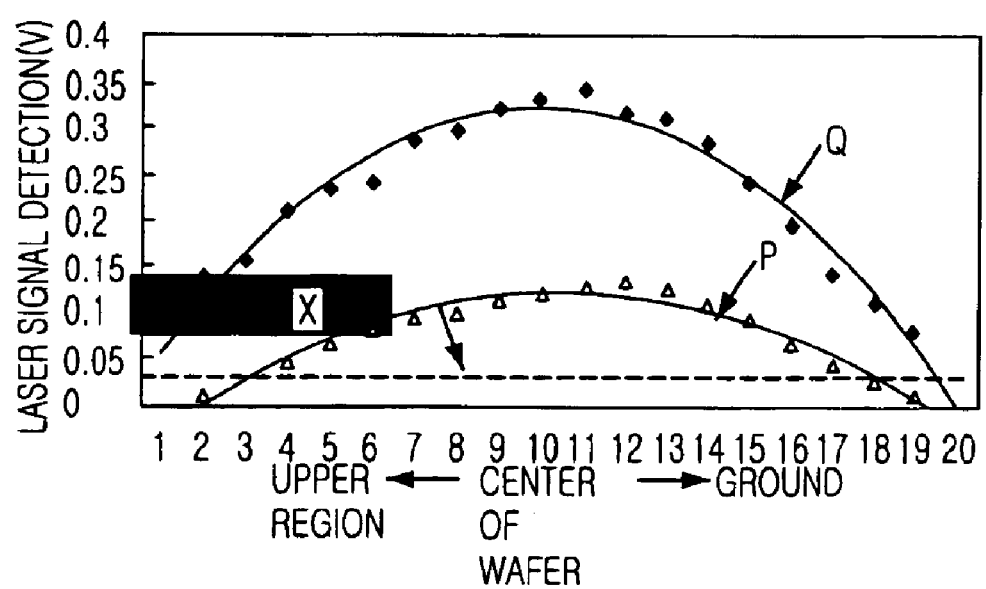
Figure 8A:
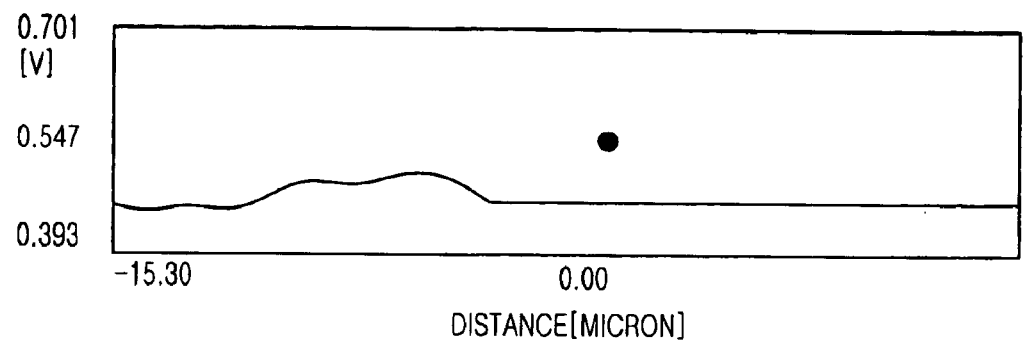
Figure 8B:
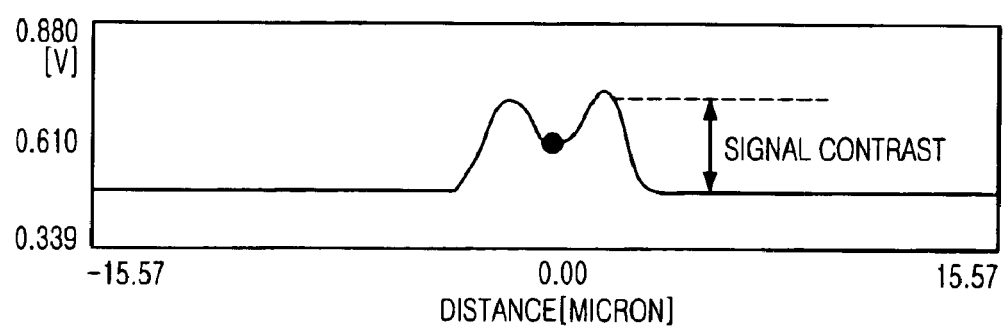

FIG. 7 is a graph showing a comparison between amplitudes of laser signals detected from a wafer after a chemical mechanical polishing (CMP) process is performed to conventional alignment mark and to alignment mark fabricated in accordance with the present invention; and FIG. 8A is a graph showing an amplitude of a laser signal detected in case of employing a conventional alignment mark; and FIG. 8B is a graph showing an amplitude of a laser signal detected in case of employing an alignment mark fabricated in accordance with the present invention.

DETAILED DESCRIPTION OF THE INVENTION

Hereinafter, descriptions on a preferred embodiment of the present invention will be explained in more detail with reference to the accompanying drawings.

According to the preferred embodiment of the present invention, each space between alignment mark patterns is formed in a manner to have a step shape or to have a gradual slope. Thus, it is possible to detect a ± first order diffract light, a ± third order diffract light and a ± fifth order diffract light each reflected from upper surfaces of the alignment mark patterns and a light combined with a zeroth order diffract light reflected from a side of the alignment mark pattern having a high reflection intensity. Herein, the ± mth order diffract light expresses a light diffracted into the mth order, where m is any integer.

As a result of this capability of detection, sensitivity to lights reflected from the alignment mark for use in a wafer alignment can be improved.

Figure 1:
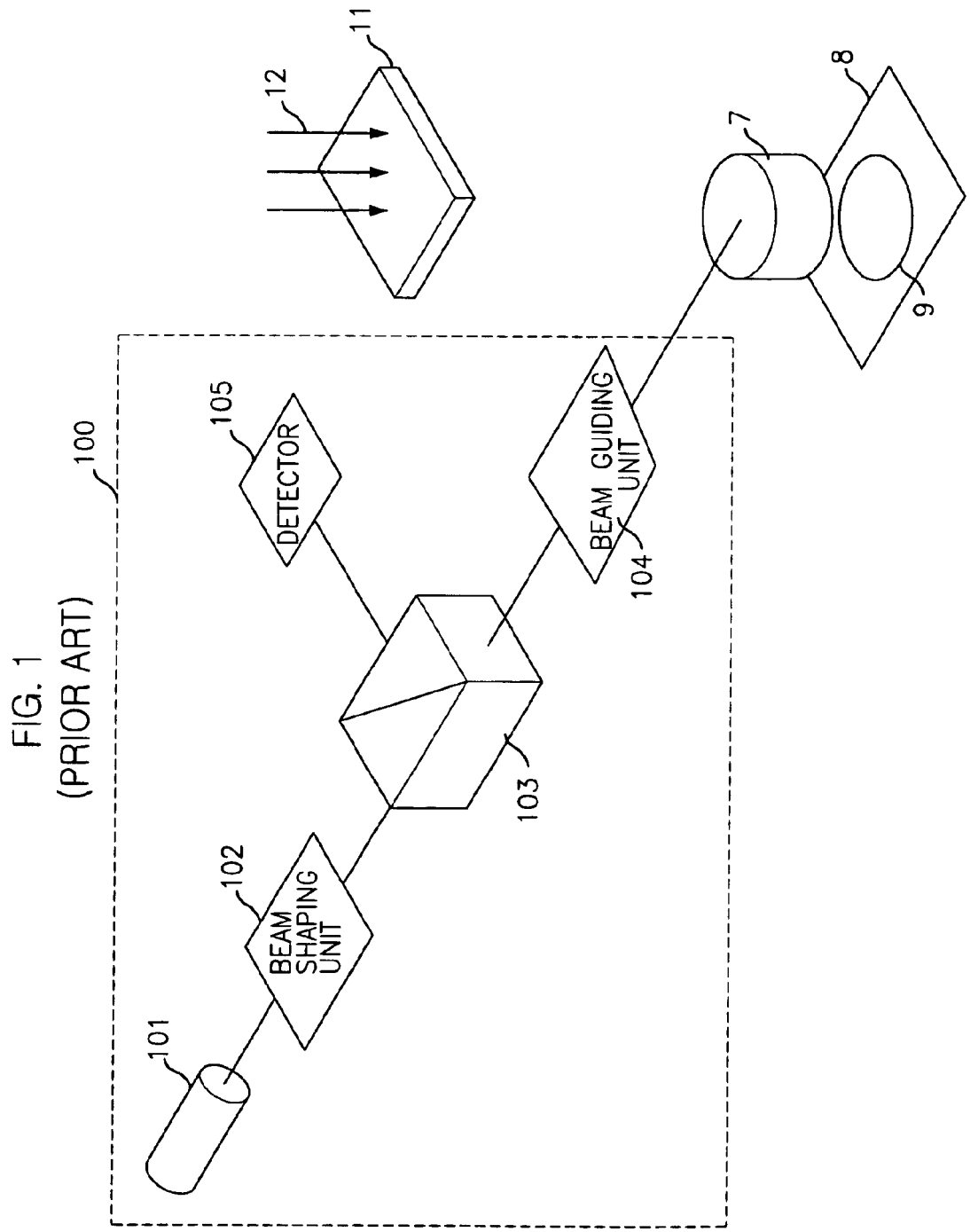
FIG. 1 is a constitution diagram showing a conventional projection photo-exposure apparatus.
Figure 2:
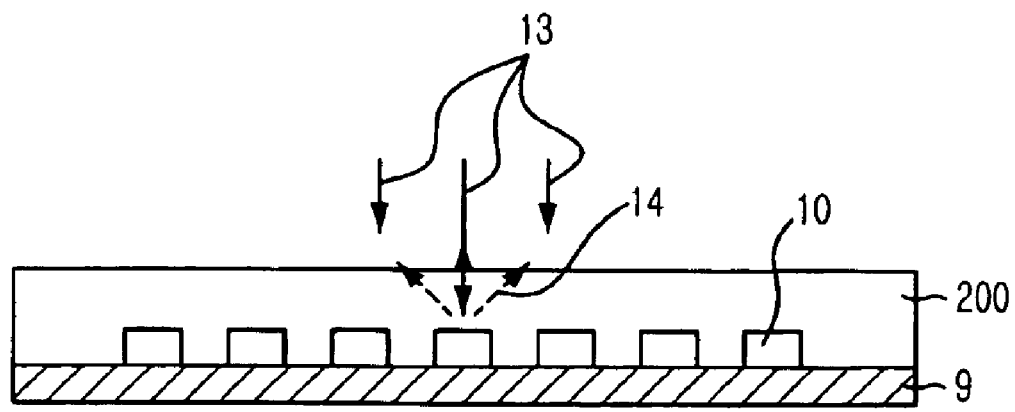
FIG. 2 is a conceptual diagram showing a detection mechanism of lights reflected and diffracted from alignment marks.
Figure 3:
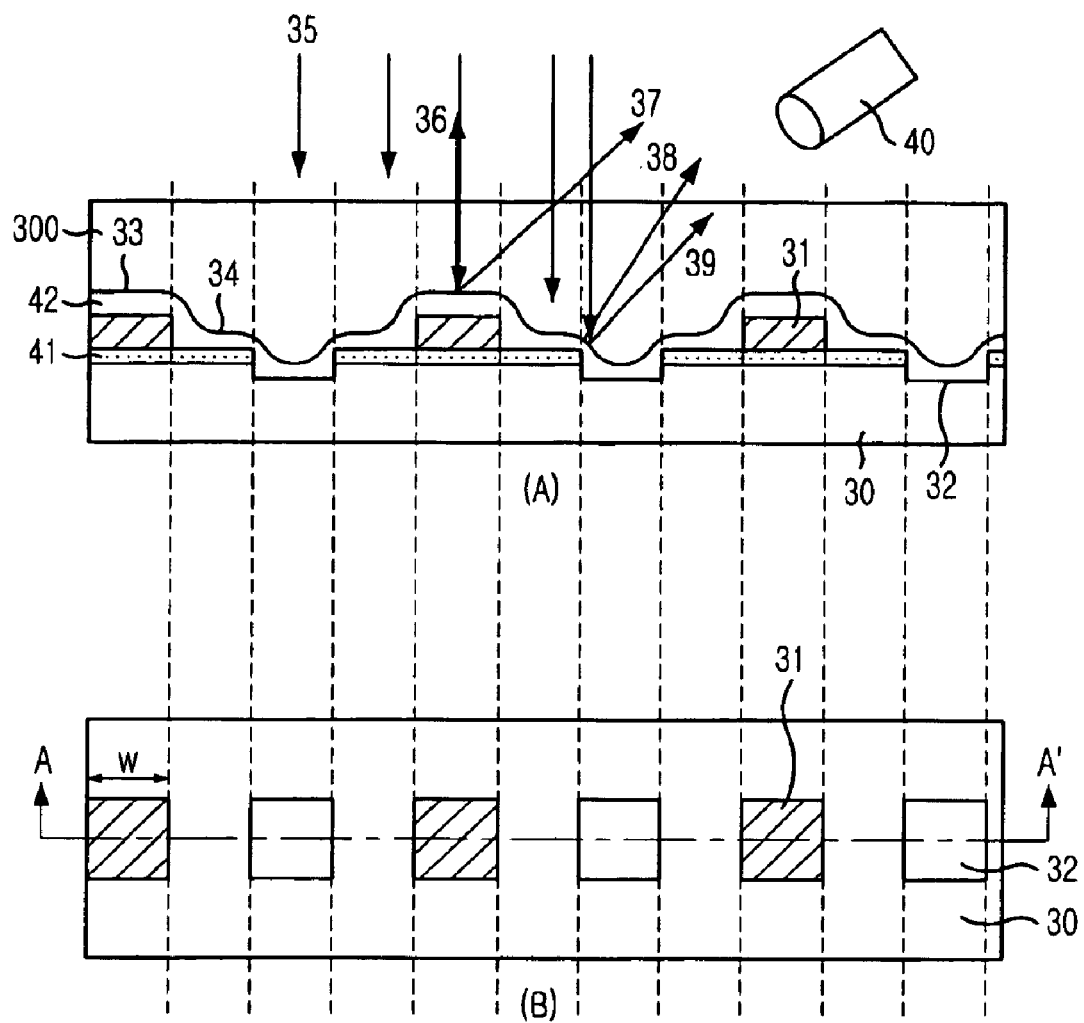
FIG. 3 shows a cross-sectional view and a top view of a semiconductor device wherein an alignment mark for use in a wafer alignment is formed in accordance with a preferred embodiment of the present invention.

FIG. 3 shows a cross-sectional view and a top view of a semiconductor device wherein alignment marks for use in a wafer alignment are formed in accordance with the preferred embodiment of the present invention. Herein, the section (B) of FIG. 3 is a top view of the semiconductor device with the alignment marks, while the section (A) of FIG. 3 is a cross-sectional view of the semiconductor device in a direction of the line A—A' shown in the section (B) of FIG. 3.

Referring to FIG. 3, the alignment mark includes a plurality of mask patterns 31 formed with a predetermined distance on a semiconductor layer 30 and a plurality of concave parts 32 formed by etching partially the semiconductor layer 30 allocated between the mask patterns 31. Also, a transparent photoresist pattern 300 is formed on an entire surface of the above resulting structure. The alignment mark is specifically used for a wafer alignment by detecting a diffracted light 38 in the zeroth order reflected from a sloped surface 34 through the use of a detector 40. Herein, a height difference between the concave part 32 and the mark pattern 31 creates the sloped surface 34.

The detector 40 also detects a ± first order diffract light 37 reflected from the a flat upper surface 33 of the mark pattern 31, a ± third order diffract light and a ± fifth order diffract light. Also, among incident lights 35, a zeroth order light 36 reflected from the flat upper surface 33 of the mark pattern 31 is subjected to a blade process and is eliminated thereafter.

Herein, the semiconductor layer 30 can be a wafer or a predetermined layer formed on a wafer.

In a cross-sectional view of FIG. 3, the concave part 32 and the mark pattern 31 have a step-like shape. The sloped surface 34 is formed between the concave part 32 and the mark pattern 31 by depositing a material such as silicon oxide.

The reference numeral 39 represents a ± first order diffract light reflected from the sloped surface 34, and the reference numeral 41 represents a mask layer used to prevent the semiconductor layer 30 from being etched when the concave parts 32 are formed, and thus to obtain an intended etch profile. Herein, the mask layer 41 is typically made of silicon nitride.

From a cross-sectional view, the mark patterns 31 and the concave parts 32 are formed in a mountain or well type. Also, it is preferred that the width of the mark pattern 31 decreases to about ⅓ or ½ of the width of the conventional mark pattern in a direction of the mark pattern arrangement in order to maintain a distance between the mark patterns, for instance, about 4 μm or about 6 μm.

As a result, it is possible to detect a light obtained by combining the ± first order diffract light 37 reflected from the flat upper surface 33 of the mark pattern 31 with the zeroth order diffract light 38 reflected from the sloped surface 34. As a result, it is further possible to improve sensitivity to mark recognition. Herein, the ± first order diffract light 37 having the reflectance intensity within about 7% of the total reflectance intensity of typically reflected lights is combined with the zeroth order diffract light 38 having the reflectance intensity above about 90% of the total reflectance intensity.

Even without the concave parts 32 as suggested in the above preferred embodiment, sloped surfaces formed between the mark patterns 31 due to the thickness of the mark pattern 31 itself make it still possible to obtain the zeroth order diffract light 38. However, the zeroth order diffract light 38 has a very weak reflectance intensity without the concave parts 32. Hence, the concave parts 32 make the height difference between the mark patterns 31 much larger, and thus, the reflectance intensity of the zeroth order diffract light 38 increases. Also, even if the concave parts 32 makes an upper layer, i.e., a silicon oxide layer 42, thicker, a profile of the mark patterns 31 can be still maintained.

Also, the size of each mark pattern 31 is decreased by arranging the mark patterns 31 in a row so that the distance between the mark patterns 31 can be maintained as like the conventional mark patterns. Thus, the conventional projection photo-exposure apparatus can be still used for the newly formed type of the mark patterns 31, and thereby reducing an additional cost.

Hereinafter, processes for forming the mark patterns shown in FIG. 3 will be described.

The mask layer 41 is first deposited on the semiconductor layer 30, and a photoresist is coated on the mask layer 41. Then, a photo-exposure and developing process performed with use of a first mask pattern for forming the concave parts 32 to form a photoresist pattern (not shown). The mask layer 41 is etched by using the photoresist pattern as an etch mask so to define pattern regions for the concave parts 32. After the etching process, the photoresist pattern is removed by employing a photoresist stripping process. Thereafter, the semiconductor layer 30 is etched by using the mask layer 41 as an etch mask to form the concave parts 32.

On top of the above entire resulting structure, a material for forming the mark patterns 31 is deposited. Herein, silicon oxide is an example of such material. Then, the photoresist is coated thereon, and a photo-exposure and developing process is performed with use of a second mask pattern for forming the mask patterns 31 to form a photoresist pattern (not shown). Then, the material is etched by using the photoresist pattern as an etch mask to form a plurality of the mark patterns 31. Next, the photoresist pattern is removed, and the silicon oxide layer 42 is additionally deposited thereafter.

Herein, the first mask pattern and the second mask pattern includes a layout for forming an isolation pattern, a gate electrode pattern, a bit line pattern, a landing plug contact (LPC) pattern, a storage node contact (SNC) pattern, metal patterns (M1 and M2) or a metal contact (MC). The first mask pattern and the second mask pattern are alternately used during the above processes.

The above mark patterns are applicable to alignment marks for use in a laser scanning alignment (LSA) method, a field image alignment (FIA) method and a scribeline primary marks (SPM) method. Hereinafter, cases of applying the above alignment mark patterns to each LSA, FIA and SPM method will be explained in detail with reference to the accompanying drawings.

Figure 4:
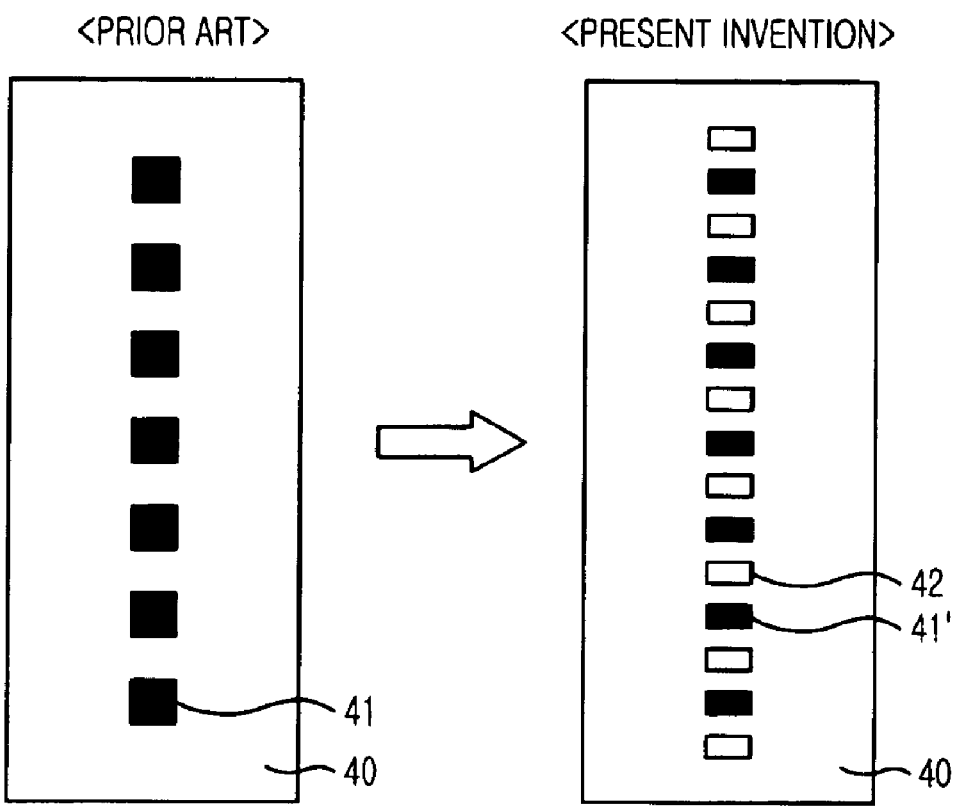
FIG. 4 is a top view showing a comparison between conventional alignment marks aligned by a laser scanning alignment (LSA) method and alignment marks of the present invention applicable to the LSA method.

FIG. 4 is a top view showing a comparison between cases of applying the LSA method to the conventional alignment marks and to the alignment marks fabricated based on the preferred embodiment.

As shown, for the conventional alignment marks aligned by the LSA method, square or rectangular alignment marks 41 are arranged with a predetermined consistent distance on a wafer 40. A ± first order diffract light reflected from an upper portion of each alignment mark 41 is detected.

Meanwhile, the size of each mark pattern 41' fabricated in accordance with the preferred embodiment of the present invention is reduced so that the spacing distance between the mark patterns 41' is the same as the spacing distance between the conventional alignment marks 40. Also, concave parts 42 are formed between the mark patterns 41' to pronounce a height difference between the mark patterns 41' and thus to detect a ± first order diffract light reflected from an upper portion of each mark pattern 41' and a zeroth order diffract light reflected from a sloped surface of each mark pattern 41'.

Figure 5:
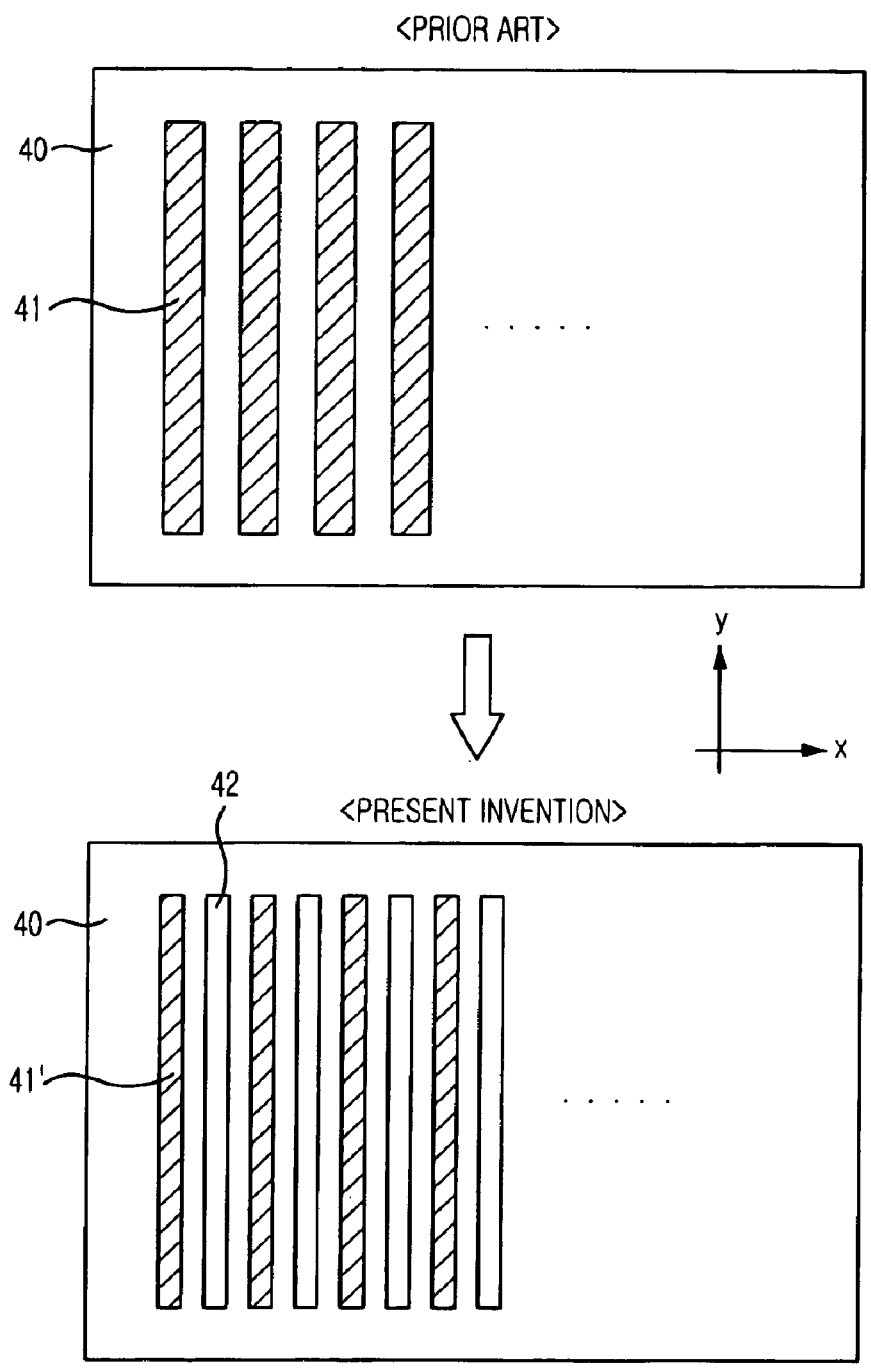
FIG. 5 is a top view showing a comparison between conventional alignment marks aligned by a field image alignment (FIA) method and alignment marks of the present invention applicable to the FIA method.

FIG. 5 is a top view showing a comparison between conventional alignment marks aligned by a field image alignment (FIA) method and alignment marks of the present invention applicable to the FIA method.

As shown, for the conventional alignment marks aligned by the FIA method, rectangular alignment marks 41 are arranged with a predetermined distance on a wafer 40. A ± first order diffract light reflected from an upper portion of each alignment mark 41 is detected.

Meanwhile, the width of each mark pattern 41', i.e., in a direction toward an x-axis, is decreased to have the same spacing distance between the mark patterns 41' as the spacing distance between the conventional alignment marks 41. Conversely, the height difference between the mark patterns 41' increases by forming the concave parts 42 between the mark patterns 41' so to detect the ± first order diffract light reflected from an upper portion of each mark pattern 41' and a zeroth order diffract light reflected from a sloped surface of each mark pattern 41'. Herein, if the mark patterns 41' are clear patterns, the concave parts 42 are a kind of dark patterns. Also, the length of each mark pattern 41', i.e., in the direction towards a y-axis, is maintained the same.

Figure 6:
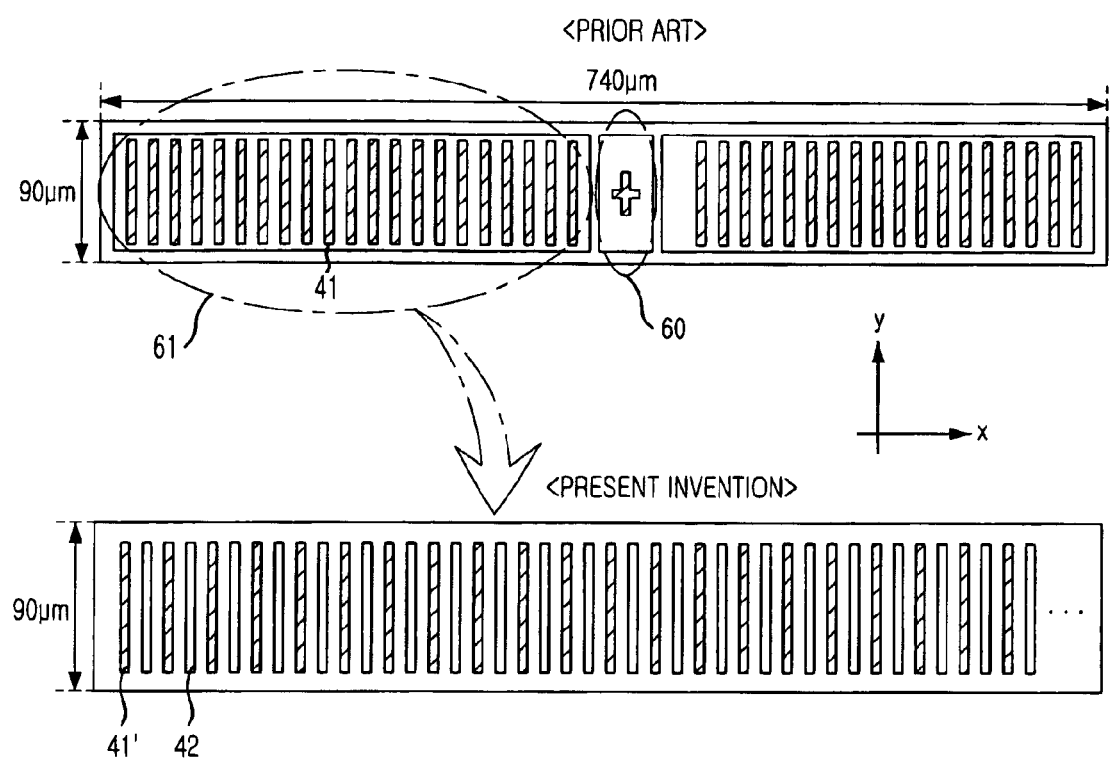
FIG. 6 is a top view showing a comparison between conventional alignment marks aligned by a scribeline primary marks (SPM) and alignment marks of the present invention applicable to the SPM method.

FIG. 6 is a top view showing a comparison between conventional alignment marks aligned by a scribeline primary marks (SPM) method and alignment marks of the present invention applicable to the SPM method.

As shown, rectangular alignment marks 41 disposed with a predetermined consistent distance are arranged into an individual group 61. An identification mark for identifying marks is formed between the groups 61 of the rectangular alignment marks 41. Therefore, only a ± first order diffract light reflected from an upper surface of each alignment mark 41 is detected.

Meanwhile, the width of each mark pattern 41', i.e., in the direction toward an x-axis, is decreased so that a spacing distance between the mark patterns 41' is the same as the spacing distance between the conventional mark patterns 41. Also, a height difference between the mark patterns 41' increases by forming the concave parts 42 between the mark patterns 42 so to detect a ± first order diffract light reflected from an upper surface of each mark pattern 41' and a zeroth order diffract light reflected from a sloped surface of each mark pattern 41'. Herein, the length of each mark pattern 41', i.e., in the direction towards a y-axis, is maintained the same as that of each conventional mark pattern 41.

FIG. 7 is a graph showing a comparison between amplitudes of laser signals detected from a wafer after a chemical mechanical polishing (CMP) process is applied to the alignment mark of the present invention and the conventional alignment mark.

Referring to FIG. 7, amplitudes of laser signals varying from an upper portion of a wafer to an edge portion of the wafer through the center of the wafer are detected by employing the conventional method P and the present invention Q. These amplitudes are expressed in values of voltage V. In case of the conventional method P, the amplitudes of the detected laser signals, i.e., voltage values, are lower than the voltage values obtained by employing the present invention Q. Particularly, the upper portion of the wafer exhibits an alignment failure X.

FIGS. 8A and 8B are graphs showing a comparison between amplitudes of laser signals detected in a respective case of employing the conventional alignment mark and of employing the alignment mark fabricated in accordance with the above preferred embodiment.

FIG. 8A shows a waveform of the detected laser signal corresponding to the alignment mark when the conventional LSA method is applied thereto for the wafer alignment. Particularly, a contrast of this detected signal waveform is weak. Also, a wafer alignment failure is shown because of a signal deviated from a central point marked in FIG. 8A.

In the mean time, FIG. 8B shows a waveform of the detected signal corresponding to the alignment mark when the LSA method is applied-thereto for the wafer alignment. Herein, the alignment mark is formed by combining multi-mark patterns having the step and well type structure as described in the preferred embodiment of the present invention. A signal contrast at concave and convex waveforms is higher than the signal contrast shown in FIG. 8A. Also, it is possible to diminish potential damages to the alignment marks during the CMP process. This fact further results in an easier detection of a central point of the signal.

As described above, the concave parts are additionally formed in the same direction of arranging the mark patterns, i.e., in a row direction. Thus, it is possible to detect a combined light of the ± first order diffract light reflected from the flat upper surface of each alignment mark and having the reflectance intensity within about 7% of the total reflectance intensity of typically reflected lights and the ± zeroth order diffract light reflected from the sloped surface of each mark pattern and having the reflectance intensity above about 90% of the total reflectance intensity of the typically reflected lights. As a result of this ability in detecting the combined light, it is possible to improve sensitivity to the mark alignments. Also, it is possible to maintain the same spacing distance between the mark patterns as the spacing distance between conventional mark patterns by decreasing the width of each mark pattern. Thus, the conventional projection photo-exposure apparatus can be used and thereby reducing an additional cost. Furthermore, these described effects contribute to increase yields of semiconductor devices.

While the present invention has been described with respect to certain preferred embodiments, it will be apparent to those skilled in the art that various changes and modifications may be made without departing from the scope of the invention as defined in the following claims.

What is claimed is:

1. An alignment mark for use in a wafer alignment, comprising:
   a first mark formed on a semiconductor layer;
   a second mark formed adjacent to the first mark on the semiconductor layer; and
   a concave part formed between the first mark and the second mark by etching a partial portion of the semiconductor layer,
   wherein the alignment mark is used to align a wafer by detecting a zeroth order diffract light reflected from a sloped surface formed because of a difference in height between the concave part and the first or second mark.

2. The alignment mark for use in the wafer alignment as recited in claim 1, wherein a ± first order diffract light, a ± third order diffract light and ± fifth order diffract light each reflected from a flat upper surface of the first mark or the second mark are detected to be used for the wafer alignment.

3. The alignment mark for use in the wafer alignment as recited in claim 1, wherein the alignment mark is applicable for use in a laser scanning alignment (LSA) method, a field image alignment (FIA) method and a scribeline primary marks (SPM) method.

4. The alignment mark for use in the wafer alignment as recited in claim 2, wherein the alignment mark is applicable for use in a laser scanning alignment (LSA) method, a field image alignment (FIA) method and a scribeline primary marks (SPM) method.

5. A method for fabricating an alignment mark for use in a wafer alignment, comprising the steps of:
   etching selectively a semiconductor layer by using a first mask pattern to form a plurality of concave parts with a predetermined consistent distance on the semiconductor layer;
   depositing a material on an entire surface of a structure containing the concave parts; and
   etching selectively the deposited material by using a second mask pattern to form a first mark and a second mark.

6. The method as recited in claim 5, wherein the first mask pattern and the second mask pattern include a layout for forming an isolation pattern, a gate electrode pattern, a bit line pattern, a landing plug contact (LPC) pattern, a storage node contact (SNC) pattern, metal patterns (M1 and M2) and a metal contact (MC) pattern.

7. The method as recited in claim 5, wherein the alignment mark is applicable for use in a laser scanning alignment (LSA) method, a field image alignment (FIA) method and a scribeline primary marks (SPM) method.

* * * * *